United States Patent [19]

Hoga

[11] Patent Number: 4,552,595
[45] Date of Patent: Nov. 12, 1985

[54] METHOD OF MANUFACTURING A SEMICONDUCTOR SUBSTRATE HAVING DIELECTRIC REGIONS

[75] Inventor: Hiroshi Hoga, Tokyo, Japan

[73] Assignee: Oki Electric Industry Co., Ltd., Tokyo, Japan

[21] Appl. No.: 606,094

[22] Filed: May 2, 1984

[30] Foreign Application Priority Data

May 13, 1983 [JP] Japan ................................. 58-82502

[51] Int. Cl.⁴ .................. H07L 21/263; H07L 21/225
[52] U.S. Cl. ............................. 148/1.5; 148/DIG. 90;
148/DIG. 117; 148/DIG. 127; 29/578; 29/576 T; 29/576 B
[58] Field of Search ................ 29/576 W, 578, 576 T, 29/576 B; 148/1.5, DIG. 90, DIG. 117, DIG. 127, 175

[56] References Cited

U.S. PATENT DOCUMENTS

| 4,292,091 | 9/1981 | Togei | 29/576 W |
|---|---|---|---|
| 4,381,201 | 4/1983 | Sakurai | 29/571 |
| 4,448,632 | 5/1984 | Akasaka | 29/576 B |
| 4,509,990 | 4/1985 | Vasudev | 148/1.5 |

FOREIGN PATENT DOCUMENTS

| 68049 | 4/1982 | Japan | 29/576 W |
|---|---|---|---|
| 100721 | 6/1982 | Japan | 29/576 T |

OTHER PUBLICATIONS

Muller et al., "On the Insulating Prop. of the Interfacial Layer Between Ion Bombard-Amorphous and Crystalline Silicons", Applied Physics, 13, 255-259, (1977).

Primary Examiner—Brian E. Hearn
Assistant Examiner—Hunter L. Auyang
Attorney, Agent, or Firm—Pollock, VandeSande & Priddy

[57] ABSTRACT

A method of manufacturing a semiconductor substrate having dielectric regions is disclosed. The method comprises steps of forming an amorphous silicon layer on the surface of a monocrystalline silicon substrate, annealing a selected surface of said amorphous silicon layer to form a crystallized region intended as an active region, subjecting the obtained structure to a thermal oxidation process to form said dielectric isolation regions, and removing an oxide coating formed on the surface of said crystallized region.

9 Claims, 8 Drawing Figures

FIG_1A
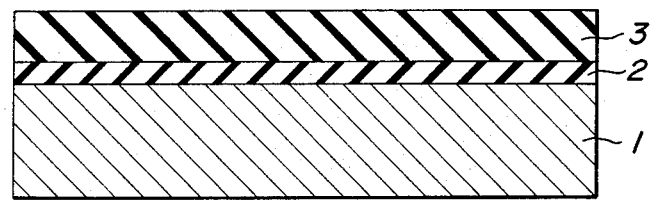
FIG_1B
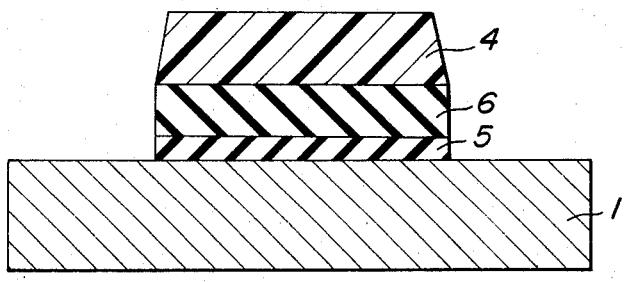
FIG_1C
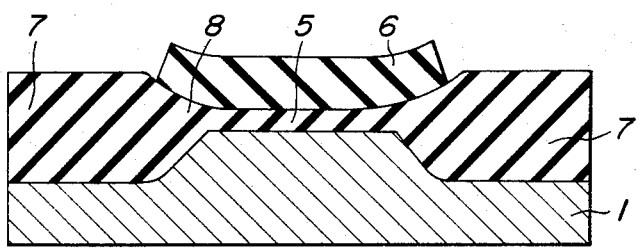
FIG_1D
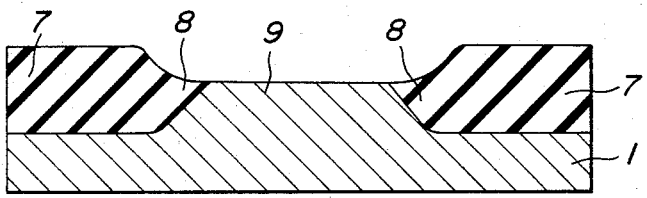

METHOD OF MANUFACTURING A SEMICONDUCTOR SUBSTRATE HAVING DIELECTRIC REGIONS

BACKGROUND OF THE INVENTION

This invention relates to a method of manufacturing a semiconductor substrate, and more particularly a method of manufacturing a substrate having dielectric isolation regions. In recent years, a selective oxidation process has been widely used for manufacturing LSI IC devices.

FIGS. 1A to 1D show a conventional method of manufacturing dielectric isolation areas on a semiconductor substrate by using the selective oxidation process.

At first, a thermally-grown silicon oxide film 2 having a thickness of about 300 Å is formed of a monocrystalline silicon substrate 1, and then a silicon nitride film 3 having a thickness of about 2000 Å is formed on the silicon oxide film 2 by using a reduced pressure CVD (chemical vapor deposition) process (FIG. 1a).

After forming the photo resist pattern 4 on the surface of the silicon nitride film 3 by a conventional photolithography process, the silicon nitride film 3 and the silicon oxide film 2 are selectively etched away to form a heat resistant mask 6 (FIG. 1b).

After removing the photo resist pattern 4, the thus obtained structure is subjected to a thermal oxidation process. Since the exposed surface of the silicon substrate 1 is thermally oxidized, the thick oxide regions 7 is formed so as to surround active regions (FIG. 1c).

Then, the silicon oxide film 2 and the silicon nitride 3 are removed to expose the surface of the active element region 9 (FIG. 1d).

However, in this selective process, oxidation invades under the edges of the nitride mask 6, thereby forming a so called bird's beak 8. The bird's beak region prevents from shrinking the width of the thick oxide region 7 used as a dielectric isolation region, so that it has been difficult to increase the packing densities of IC devices. In addition, since active regions are designed in consideration of the generation of the bird's beak, it has been difficult to accurately define the areas thereof.

SUMMARY OF THE INVENTION

It is an object of the present invention to overcome the above-described disadvantage of the conventional method of manufacturing a semiconductor substrate for IC devices.

It is another object of the present invention to provide an improved method of manufacturing a semiconductor substrate which can miniaturize IC devices having dielectric isolation regions.

It is still another object of the present invention to provide an improved method of manufacturing a semiconductor substrate which can eliminate the step of making a nitride mask.

According to the present invention there is provided a method of manufacturing a semiconductor substrate having dielectric isolation regions comprising steps of forming an amorphous silicon layer on the surface of a monocrystalline silicon substrate, annealing a selected surface of amorphous silicon layer to form a crystallized region intended as an active region, subjecting the obtained structure to a thermal oxidation process to form the dielectric isolation regions, and removing an oxide coating formed on the surface of the crystallized region.

According to the present invention there is provided a method of manufacturing a semiconductor substrate having dielectric isolation regions comprising steps of forming a polycrystalline silicon layer on the surface of monocrystalline silicon substrate, annealing a selected surface of the polycrystalline silicon layer to form a crystallized region intended as an active region, subjecting the obtained structure to a thermal oxidation to form the dielectric isolation regions, and removing an oxide coating formed on the surface of the crystallized region.

BRIEF DESCRIPTION OF THE DRAWING

These and other features and advantages of the present invention will become readily apparent from the following detailed description of one embodiment of the present invention, particularly when taken in connection with the accompanying drawings wherein like reference numerals designate like or functionally equivalent parts throughout, and wherein;

FIGS. 1a and 1d are cross-sectional views showing a prior art method of manufacturing a semiconductor substrate with bird's beak regions.

DESCRIPTION OF THE PREFERRED EMBODIMENT

Figure 2A:
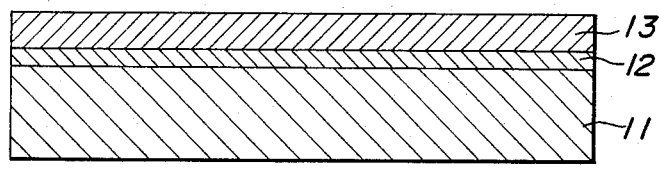
FIGS. 2a and 2d are cross-sectional views showing a method of manufacturing a semiconductor substrate without bird's beak regions according to the present invention.

Referring now to the drawings, there is shown an embodiment of a method of manufacturing a semiconductor substrate in a dielectric isolation structure without bird's beak regions according to the present invention.

In FIG. 2a, the monocrystalline silicon substrate 11 is ion-implanted with phosphorus at an accelerating energy of 20 to 60 keV at a dose of $1 \times 10^{14}$ to $5 \times 10^{15}$ cm$^{-2}$ to convert the surface of the silicon substrate into an amorphous layer 12 of 300 to 1000 Å in depth. To make the surface of a silicon substrate an amorphous state, boron and arsenic may be utilized as implanting particles. In this case, boron is implanted at an accelerating energy of 10 to 30 keV at a dose of $1 \times 10^{15}$ to $1 \times 10^{16}$ cm$^{-2}$, and arsenic at an accelerating energy of 40 to 100 keV at a dose of $1 \times 10^{14}$ to $1 \times 10^{15}$ cm$^{-2}$.

Next, another amorphous silicon layer 13 is formed by a plasma CVD(chemical vapor deposition) process utilizing silane (SiH$_4$) and phosphine (PH$_3$) to contain phosphorus and to have a thickness of about 3000 Å.

Figure 2B:
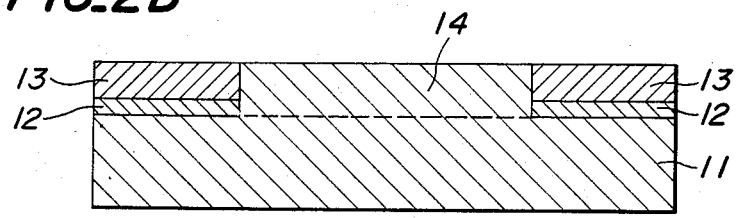

The amorphous silicon layers 12 and 13 are annealed by a CW(continuous wave) argon laser beam of a power output of about 17 W/cm$^2$ in a nitrogen atmosphere under a temperature of 500° C. to form the crystallized region 14 intended as an active region (FIG. 2b). In this case, active regions having desired areas can be obtained by adjusting the diameter of the laser beam and by scanning a laser beam on the surface of the amorphous silicon layer 11.

Figure 2C:
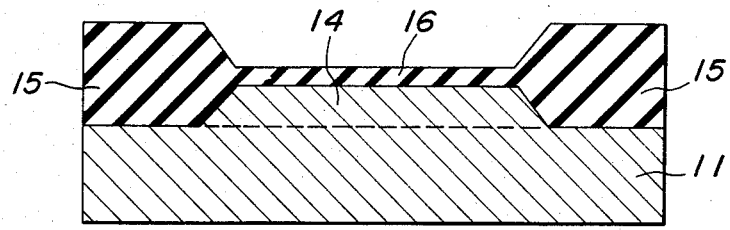

Next, with a mixed gas of oxygen and hydrogen, the structure is subjected to a thermal oxidation process at a temperature of about 850° C. for about 160 minutes. Since the rate of oxidation of amorphous is quicker than that of monocrystalline silicon, the thick oxide layer 15 of about 6000 Å acting as an dielectric isolation is formed over the surface of the silicon substrate 11, while the thin oxide silicon layer 16 of about 800 Å is formed over the surface of the crystallized region 14 (FIG. 2c).

Figure 2D:
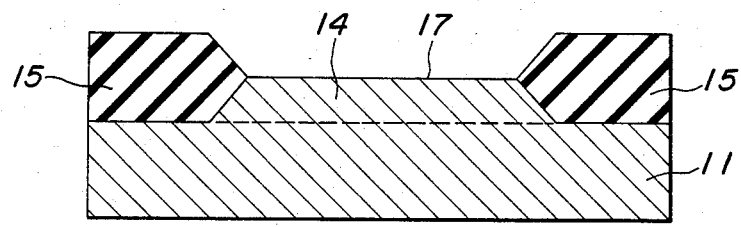

Finally, the thin oxide surface 16 is etched off with a buffered hydrofluoric acid solution to expose the surface 17 of the active region 14 (FIG. 2d). The obtained structure is subjected to the following conventional wafer processes to complete IC devices.

As described above, since the difference of oxidation rate between monocrystalline silicon and amorphous silicon suppresses oxidation in a lateral direction, it can prevent from generating the bird's beaks. This results in miniaturization of active regions and dielectric isolation regions.

In addition, since this method patterns active regions by directly scanning an argon laser beam on the surface of a silicon substrate, the number of conventional photo lithography steps for nitride masks can be eliminated.

In another embodiment, a polycrystalline silicon layer may be formed on the surface of the monocrystalline silicon substrate 11 by a chemical vapor deposition process, and then a selected surface of the polycrystalline silicon layer is crystallized by irradiating energy beam. To obtain a polycrystalline layer of 2000 to 4000 Å, boron may be implanted at an accelerating energy of 50 to 150 keV at a dose of $5 \times 10^{15}$ to $5 \times 10^{16}$ cm$^{-2}$ to the surface of the monocrystalline silicon substrate 11.

In this invention, an electron beam also can be used as means for annealing amorphous and polycrystalline silicon layers.

What is claimed is:

1. A method of manufacturing a semiconductor substrate having dielectric isolation regions comprising steps of forming an amorphous silicon layer on the surface of a monocrystalline silicon substrate by implanting ions in the surface of said monocrystalline substrate to produce a first layer of amorphous silicon on said substrate, chemically vapor depositing a second amorphous layer of silicon onto said first layer, annealing a selected zone of said amorphous silicon layers to form a crystallized region intended as an active region, subjecting the resulting structure to a thermal oxidation process to form said dielectric isolation regions, and removing an oxide coating formed on the surface of said crystallized region.

2. A method as claimed in claim 1, wherein said annealing is carried out by irradiating a laser beam to said selected surface of said amorphous silicon layers.

3. A method as claimed in claim 1, wherein said annealing is carried out by irradiating an electron beam to said selected surface of said amorphous silicon layers.

4. A method as claimed in claim 1, wherein said annealing is carried out by irradiating an ion beam to said selected surface of said amorphous silicon layers.

5. A method as claimed in claim 1, wherein said monocrystalline silicon layer is implanted with boron at an acceleration energy of 50 to 150 keV at a dose of $5 \times 10^{15}$ to $5 \times 10^{16}$ cm$^{-2}$.

6. A method as claimed in claim 1, wherein said monocrystalline silicon layer is implanted with phosphorous at an acceleration energy of 20 to 60 keV at a dose of $1 \times 10^{14}$ to $5 \times 10^{15}$ cm$^{-2}$.

7. A method as claimed in claim 1, wherein said monocrystalline silicon layer is implanted with boron at an acceleration energy of 10 to 30 keV at a dose of $1 \times 10^{15}$ to $1 \times 10^{16}$ cm$^{-2}$.

8. A method as claimed in claim 1, wherein said monocrystalline silicon layer is implanted with arsenic at an acceleration energy of 40 to 100 keV at a dose of $1 \times 10^{14}$ to $1 \times 10^{15}$ cm$^{-2}$.

9. A method as claimed in claim 2, wherein said laser beam is an argon laser beam.

* * * * *

UNITED STATES PATENT AND TRADEMARK OFFICE
CERTIFICATE OF CORRECTION

PATENT NO. : 4,552,595
DATED : November 12, 1985
INVENTOR(S) : Hiroshi Hoga

It is certified that error appears in the above-identified patent and that said Letters Patent is hereby corrected as shown below:

Column 1, line 19, "of" (2nd occurrence) should be -- on --.

Column 2, line 23 "FIGS. 1a and 1d" should be -- FIGS. 1a to 1d --.

Column 2, line 26, "FIGS. 2a and 2d" should be -- FIGS. 2a to 2d --.

Signed and Sealed this

Tenth Day of June 1986

[SEAL]

Attest:

Attesting Officer

DONALD J. QUIGG

Commissioner of Patents and Trademarks